(12) United States Patent
Anandhakrishnan

(10) Patent No.: US 9,500,393 B2
(45) Date of Patent: Nov. 22, 2016

(54) SYSTEM AND METHOD FOR OPTIMAL COOLING BY THERMO ELECTRIC COOLING MODULE (TEC) AND AN ELECTRIC FAN THEREOF

(71) Applicant: Vaidyanathan Anandhakrishnan, Bangalore (IN)

(72) Inventor: Vaidyanathan Anandhakrishnan, Bangalore (IN)

(*) Notice: Subject to any disclaimer, the term of this patent is extended or adjusted under 35 U.S.C. 154(b) by 231 days.

(21) Appl. No.: 14/360,441

(22) PCT Filed: Nov. 24, 2012

(86) PCT No.: PCT/IB2012/056701
§ 371 (c)(1),
(2) Date: May 23, 2014

(87) PCT Pub. No.: WO2013/076707
PCT Pub. Date: May 30, 2013

(65) Prior Publication Data
US 2014/0305141 A1    Oct. 16, 2014

(30) Foreign Application Priority Data

Nov. 25, 2011   (IN) .............. 4079/CHE/2011

(51) Int. Cl.
*F25B 21/02* (2006.01)
*F24F 5/00* (2006.01)
*H01L 35/30* (2006.01)

(52) U.S. Cl.
CPC ............. *F25B 21/02* (2013.01); *F24F 5/0042* (2013.01); *H01L 35/30* (2013.01)

(58) Field of Classification Search
CPC ....... F25B 21/02; F24F 5/0042; H01L 35/30
USPC ........................................................ 62/3.2
See application file for complete search history.

(56) References Cited

U.S. PATENT DOCUMENTS

| | | | |
|---|---|---|---|
| 3,015,222 A * | 1/1962 | Wellborn | F25B 31/008 417/366 |
| 5,007,242 A * | 4/1991 | Nakayama | A47F 3/0495 62/247 |
| 5,189,412 A | 2/1993 | Mehta | |
| 5,590,532 A | 1/1997 | Bachman | |
| 5,818,131 A * | 10/1998 | Zhang | B63H 11/08 128/DIG. 3 |
| 6,393,842 B2 | 5/2002 | Kim | |
| 6,502,405 B1 * | 1/2003 | Van Winkle | F01P 9/06 62/239 |
| 6,722,139 B2 | 4/2004 | Moon | |
| 7,890,215 B2 | 2/2011 | Duncan | |
| 7,926,293 B2 | 4/2011 | Bell | |
| 2003/0029173 A1 * | 2/2003 | Bell | F24F 5/0042 62/3.3 |
| 2003/0140636 A1 * | 7/2003 | Van Winkle | F01P 9/06 62/3.61 |
| 2004/0241048 A1 * | 12/2004 | Shin | B01L 7/52 422/400 |

(Continued)

*Primary Examiner* — Mohammad M Ali
(74) *Attorney, Agent, or Firm* — Robert Plotkin, P.C.; Robert Plotkin, Esq.

(57) ABSTRACT

The various embodiments of the present system disclose a system for an optimal cooling by a thermoelectric cooling module and an electric fan thereof. The system comprises a thermoelectric cooling module, an electric fan and a housing. The thermoelectric cooling module comprises a plurality of thermoelectric sub-modules, a hot side management module, a cold side management module and an integrated control module. The present invention provides an optimal cooling on the basis of an external weather condition. The present invention further provides an optimal cooling by implementing an efficient fluid circulation mechanism. The present invention also provides a dynamic management over the working of various modules of the said system.

11 Claims, 14 Drawing Sheets

(56) References Cited

U.S. PATENT DOCUMENTS

| | | |
|---|---|---|
| 2010/0012307 A1 | 1/2010 | Taras |
| 2010/0022177 A1* | 1/2010 | Hidaka .............. B60H 1/00478 454/156 |
| 2010/0101236 A1 | 4/2010 | Shah |
| 2010/0154437 A1* | 6/2010 | Nepsha .................... F24F 1/02 62/3.4 |
| 2010/0274396 A1* | 10/2010 | Yang ................ B60H 1/00385 700/278 |
| 2010/0326091 A1* | 12/2010 | Enayati .............. B60H 1/00478 62/3.3 |
| 2011/0017252 A1* | 1/2011 | Braun .................... F24F 5/0042 136/204 |
| 2011/0030754 A1* | 2/2011 | Smythe .................. H01L 35/08 136/233 |
| 2011/0064621 A1* | 3/2011 | Francis, Jr. ............. C01B 13/10 422/186.2 |
| 2011/0168379 A1 | 7/2011 | Morgan |
| 2011/0174001 A1 | 7/2011 | Carlson |

* cited by examiner

SYSTEM AND METHOD FOR OPTIMAL COOLING BY THERMO ELECTRIC COOLING MODULE (TEC) AND AN ELECTRIC FAN THEREOF

A) TECHNICAL FIELD OF INVENTION

The present invention generally relates to an electronic system along with an electromechanical device for a closed space and particularly relates to a system and a method for providing on an adaptive comfort for the occupants of the closed space. The present invention more particularly relates to a system and a method for providing an effective and efficient cooling management mechanism on the basis of an ambient weather condition.

B) BACKGROUND OF INVENTION

Traditionally the electric fans are used to provide thermal relief for the occupants in a habitable closed space such as a room. Generally, an electric fan re-circulates the room air at different velocities, which varies between 300 to 800 rpm (1.5 m/s to 4 m/s) as the terminal velocity at the outlets or the fan blades. These fans typically consume less power (40 to 80 watts per hour). The movement of air at a reasonable speed provides thermal relief to some extent, but suffers from one disadvantage that they cannot reduce the room temperature or provide desirable thermal comfort. Typically these closed spaces may have a wall or more walls exposed to the ambient environment. When the ambient or outside temperatures rise to a higher level, the room air temperature also rises. Thus, the fans re-circulate the warm air that makes the indoor environment uncomfortable. Further, prolonged use of electric fan may keep re-circulating the warm or hot air in the room, which adds to the discomfort of the occupants.

When there is a desire to seek better and enhanced thermal comfort with reduced temperature and dehumidification, air conditioners are used that provide excellent cooling but at the same time are not considered as environment friendly as the compressors use environment impacting CFC (Chloro Fluoro Carbons), that have ODP (Ozone depletion potential) and GWP (global warming potential). Apart from the direct effect due to CFCs, there is an indirect contribution to GWP through the power required to run the air conditioners. These cause damage to ozonosphere of the earth and leads to greenhouse effect that affect the climatic conditions and eventually affect human beings. When air conditioners are functioning, based on the predefined temperatures, the temperature control device of the air conditioner activates the compressor. When the compressor is ON, cool and dehumidified air is blown into the room and when the compressor is OFF, the air inside the room is re-circulated. This fluctuation creates wide temperature swings inside the room. It is widely known that the inside temperatures, that are substantially lower than ambient temperatures prevalent outside, could cause thermal shocks for occupants when they move in and out of the conditioned room. By virtue of their functioning, an air conditioner cools the room to a low temperature, which creates heat flow across the walls and windows into the room. This necessitates cooling the room or entire space that is substantially higher than the cooling required for the occupants alone. Apart from that, the air conditioners are also expensive and are energy intensive that require substantially high power (an air conditioner requires about 1000 watts/hr per TR), which causes a huge load on the grid power and cannot be afforded by most of the people.

In several regions there is no continued supply of grid power. Hence, a combination of non availability of regular power supply, high energy bills per month makes air conditioner unaffordable to most of the people.

Later since the past few years, the thermo electric devices for heating and cooling on the basis of the Peltier effect are used. A thermo electric (TE) device is composed of thermo electric couples such as n-type and p-type semiconductors. These thermo electric couples are connected in series and sandwiched between the two substrates. When specified voltage is applied across the two elements, electron flow in the TE device creates a cold side and a hot side. The thermoelectric technology is mainly used in the circumstances where both heating and cooling is required in the face of the changing operating environment. This TE technology has wide variety of applications in various fields such as lunch boxes to water coolers, food service equipment, laser applications, and highly-specialized instrumentation and testing equipment to provide effective localized cooling solutions.

One of the prior arts discloses a cooling fan with a thermostatic air output by providing a water absorbing curtain, a water cistern, a thermo electric module and an electric fan. The water absorbing curtain is positioned between the electric fan and a wind inlet wherein the water cistern is placed above the water absorbing curtain for supplying the water. The thermo electric module is configured inside the cistern for cooling down the water so that the water absorbing curtain absorbs moisture of lower temperature by means of a sucking function of the said electric fan in front of the said water absorbing curtain. Therefore, the electric fan produces an effective cool air to the room occupant.

Another prior art discloses a thermoelectric cooler employed electric fan that provides cooling to a desired space. The thermoelectric cooler includes a thermoelectric element for absorbing or dissipating heat at a junction of two different metals depending on a direction of a current flowing through the junction, a fan blade set for blowing air cooled at a heat absorption side of the thermoelectric module to a desired place.

However, a major limitation that exists in the prior arts is that the air is sucked across the water absorbing curtain and the equipment functions like an evaporative cooling system or air cooler or a swamp cooler when air is drawn across different media. Moreover, the dirt of the incoming air contaminates the water and lends to undesirable foul smell, bacteria formation in water and causes severe health hazards to the occupants. In the other case, cooling system does not provide a condensate drain system and hence the condensate will drip on the floor or condensate particles may be sprayed on the occupants like a water shower. Further the limitations lie in the conventional cooling systems that they provide only temperature reduction, without a humidity control and are unable to differentiate between various seasons in a particular geographical region.

In the view of foregoing, there is a need for a system and a method to provide optimal local cooling based on an adaptive comfort in a closed premise. Further, there is a need for a system and a method, which avoids the use of harmful cooling gases like CFCs. Further, there is a need for a system and a method to provide variable cooling on the basis of outside weather condition as well as a geographical condition. Further, there is a need for a system and a method for the occupants to seek a localized optimal cooling that provides cool and dehumidified air to the said space.

The above mentioned shortcomings, disadvantages and problems are addressed herein, as detailed below.

C) OBJECTS OF THE INVENTION

The primary object of the present invention is to provide a system and a method for providing an optimal cooling through a thermoelectric cooling module and an electric fan.

Another object of the present invention is to provide a system and a method for providing an optimal cooling on the basis of an external weather conditions.

Yet another object of the present invention is to provide a system and a method for providing an optimal cooling by implementing an efficient fluid circulation mechanism.

Yet another object of the present invention is to provide a system and a method with a dynamic management over the working of various modules of the said system.

These and other objects and advantages of the embodiments herein will become readily apparent from the following detailed description taken in conjunction with the accompanying drawings.

D) SUMMARY OF THE INVENTION

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

The various embodiments of the present system disclose a system for an optimal cooling by a thermoelectric cooling module and an electric fan thereof. The system comprises a thermoelectric cooling module, an electric fan and a housing. The thermoelectric cooling module comprises a plurality of thermoelectric sub-modules, a hot side management module, a cold side management module and an integrated control module. The plurality of thermoelectric sub-modules is connected electrically in series. The plurality of thermoelectric sub-modules is connected thermally in parallel. The plurality of thermoelectric sub-modules is fixed to a rigid surface by sandwiching and soldering between at-least two ceramic plates. The plurality of thermoelectric sub-modules is also called Peltier chip(s). The hot side management module provides a fluid circulation to the plurality of thermoelectric sub-modules. The cold side management module provides a fluid circulation to the plurality of thermoelectric modules. The cold side management module is connected at a pre-determined separation from the hot side management module. The integrated control module is connected to the plurality of thermoelectric sub-module, the hot side management module, the cold side management module and an electric fan. The integrated control module controls the working of the plurality of thermoelectric sub-module, the hot side management module, the cold side management module and an electric fan. The housing provides an enclosure for the plurality of thermoelectric sub-modules, the hot side management module and the cold side management module. The components of the thermoelectric cooling module are made of a minimum heat loss circuitry. The electric fan may be driven by an alternate current or a direct current. The electric fan runs at variable speeds or has variable oscillations. A speed or an oscillation of the electric fan is dynamically varied by the integrated control module. The oscillation of the electric fan is provided under a direct current supply or an alternate current. The plurality of thermoelectric sub-modules restricts a contact between a hot side management module and a cold side management module. The plurality of thermoelectric sub-modules avoids a condensation of air on the cold side management system by preventing an entrapment of the air.

According to one embodiment of the present invention, the hot side management module comprises a fluid supply source, a fluid cooling sub-module, a storage housing, a primary fluid level sensor module, a pump, a primary heat exchanger module, a heat dissipation module and a control circuit. The fluid supply source supplies a fresh ambient fluid at a natural wet-bulb temperature. The fluid cooling sub-module is connected with the fluid supply source. The fluid cooling sub-module cools a fresh ambient fluid to a natural wet bulb temperature. The storage housing holds the fluid required for an operation of the said system. The said storage housing has a plurality of compartments, which are provided for a plurality of fluid circuits. The plurality of fluid circuits facilitates a transfer of an ambient or a fresh fluid, a heat dissipation, a heat transfer and a fluid drain. The primary fluid level sensor module tracks an instantaneous level of fluid. The pump maintains a fluid flow across the hot side management module. The primary heat exchanger module collects the heat from the hot side management system by supplying the fluid. The primary heat exchanger module provides at-least one piping or at-least one conduit to collect the heat carrying fluid. The heat dissipation module disposes the collected heat and resupplies the heat carrying fluid back to the storage system. The control circuit regulates the flow of fluid or fluid among the plurality of compartments and the heat dissipation module to maintain fluid at a planned and guided temperature. The hot side management module comprises a plurality of pressure regulatory valves. The plurality of pressure regulatory valves regulates fluid in the hot side management module and the cold side management module. The hot side management module directly disposes excess fluid.

According to one embodiment of the present invention, the cold side management module comprises of a primary heat exchanger, a looped module, a fluid sub cooling module, a storage housing, pump, a fluid regulatory valve, circulatory module, a secondary heat exchanger with plurality of fins and a condensate disposal mechanism. The plurality of fins is provided with a gradient, which further comprises a plurality of grooves. The looped module consists of a fluid. The looped module is either an open module or a closed module. The fluid provides a temperature regulation in the cold side management module. The fluid circulation system comprises a storage housing, a secondary fluid level sensor and a pressure adjusting mechanism. The storage housing holds the fluid required for the operation of the said system. The said storage housing has a plurality of compartments provided for a plurality of fluid circuits. The plurality of fluid circuits facilitates a transfer of an ambient or a fresh fluid, a heat dissipation, a heat transfer and a fluid drain. The secondary fluid level sensor functions either manually or automatically. The secondary heat exchanger module is made either of a metal or a non metal. The secondary heat exchanger module on the cold side management module is aerodynamically designed to facilitate minimum pressure losses. The pressure adjusting mechanism comprises a plurality of pressure relief valves and a pumping module. The pressure regulatory valves relieve extra pressure caused due to an excess fluid to maintain required fluid flow. The pumping module pumps a cold fluid across the secondary heat exchanger module. The condensate disposal mechanism collects a condensed fluid through a condensate conduit. The condensate disposal mechanism consists of collecting loop and a disposing mechanism. The plurality of grooves collects the vertically dripping condensate on the surface of the plurality of fins with condensate flowing in the plurality of grooves due to the gradient with collecting loop along the edge of all the fins. The plurality of grooves routes the condensing fluid to the collecting loop. The collecting loop is connected to the disposing mechanism. The disposing mechanism disposes the condensed fluid either through a return conduit of fluid or through a direct medium.

According to one embodiment of the present invention, the integrated control module further comprises three sub-modules. The three sub-modules comprise of a calibration sub-module, a control sub-module and a power sub-module. The calibration sub-module comprises a plurality of sensors to calibrate a temperature and relative humidity of the ambient air and inside air. The calibration sub-module further calibrates plurality of air properties. The plurality of air properties comprises a wet bulb temperature, a dew point temperature, an absolute humidity, a specific air volume and enthalpy. The control sub-module comprises an algorithm. A program through the control sub-module provides an appropriate setting of the indoor temperature and the relative humidity. The control sub-module provides an adaptive thermal comfort that depends upon the ambient air property and a capacity of the thermoelectric cooling module. The control sub-module regulates the speed of the electric fan. The control sub-module also regulates fluid flows in both the hot side and the cold side management module and the total power to thermoelectric cooling module on the basis external temperature and humidity. The power sub-module provides an alternate current or a direct current to the thermoelectric cooling module, a fan, a pump and a plurality of electrically powered components including a plurality of sensors. The power sub-module enables an integrated control system to vary a cooling capacity of the plurality of thermoelectric sub-modules. The power sub-module regulates the flow of fluid to transfer the heat. The power sub-module further varies the speed of the electric fan to increase or decrease the air flow. The power module senses the level and the temperature of the fluid in the hot side management module and the fluid in the cold side management module. The calibration sub-module, the control sub-module and the power sub-module work seamlessly and continuously with a sensors feeding information and controls operating the various components to effect dynamic operation of all the components and the said system.

According to one embodiment of the present invention, the hot side management module provides enhanced heat dissipation by maintaining a temperature of the fresh fluid equivalent to the wet bulb temperature of ambient air. The mode of heat dissipation through the hot side management module comprises a fluid in a closed loop mode and an open loop mode. The hot side management module applies a closed loop mode to circulate the working fluid for disposing the heat carried along with a circulated fluid. The open loop provides a fresh supply of fluid for cooling. The open loop provides a separate exit conduit for fluid disposal. The supply of fresh fluid is maintained at temperature of ambient wet bulb to provide enhanced heat dissipation in both the closed loop and the open loop.

According to one embodiment of the present invention, the cold side management module provides enhanced heat exchange between the room air and the operating fluid through the secondary heat exchanger module that has plurality of fins. The mode of heat dissipation through the cold side management module comprises a fluid in a closed loop mode and the open loop mode. The cold side management module applies to circulate the working fluid for disposing the heat carried along with a circulated fluid. The open loop provides a fresh supply of fluid for cooling. The open loop provides a separate exit conduit for fluid disposal. The supply of fresh fluid is maintained at temperature of ambient wet bulb to provide enhanced heat dissipation in both the closed loop and the open loop.

According to one embodiment of the present invention, the said system comprises at least one processor, a computer readable medium and at least one computer readable code embedded in the computer readable medium. The computer readable code instructs at-least one processor to perform a plurality of functions. The plurality of functions comprises obtaining data to determine an amount of fluid in the storage housing and providing a plurality of operating signals on the basis of the obtained data. The plurality of operating signals is provided to the fluid supply source in the hot management module and the fluid circulatory module in the cold side management module. The plurality of operating signals enable an operation of the fluid supply source in the hot management module and the fluid circulatory module in the cold side management module for a predetermined time interval.

According to one embodiment of the present invention, the hot side management module and the cold side management module are provided in a single housing.

According to one embodiment of the present invention, the hot side management module and the cold side management module are provided in separate housing.

The embodiments of the present invention disclose a method for an optimal cooling by a thermoelectric cooling module and an electric fan thereof. The method comprises initiating the said system, wherein the electric fan in the said system is switched "ON" and calibrating a plurality of thermal and environmental parameters through the integrated control module. The method further comprises the plurality of parameters comprising a temperature, an ambient pressure, a specific volume of air and a humidity. The method further includes the steps of providing a plurality of guideline to the said system and instructing the hot side management module and the cold side management module to function within the provided guidelines. The plurality of guidelines is provided by the integrated control module on the basis of the plurality of calibrated parameters. The plurality of guidelines is dynamic in nature and varies with variation in the plurality of calibrated parameters. The method further comprises maintaining a temperature of the fluid in the fluid circulation mechanism at a wet bulb temperature and maintaining an adequate fluid flow on the basis of the plurality of calibrated parameters. The method further comprises collecting the heat generated in the hot side management module and the cold side management module and disposing the collected heat.

According to one embodiment of the present invention, the cold side management module provides a cooling effect by distributing the heat uniformly across the surface of the secondary heat exchanger module as well as a plurality of fins and groves provided in the system. The cold side management applies a gradient to collect a condensate formed due to condensation of the room air under specific conditions. The cold side management module disposes the collected condensate either through a reverse circulation of the fluid or directly to the ambient environment.

According to one embodiment of the present invention, the integrated control module facilitates a plurality of calibrations. The plurality of calibrations comprises calculating the ambient and the room air properties, setting a plurality of indoor performance parameters to facilitate an adaptive comfort and powering the said system with either an alternate current or a direct current with varying voltages and currents.

According to one embodiment of the present invention the system may be controlled through a wired control device or by using a hand held remote device. Additionally, the Integrated Control System contains provisions for internet or SMS or GPRS compatible communication to remote manage the system to switch ON the unit before reaching home or integrate with the energy management system or building management system controlling multiple number of rooms or the entire building.

E) BRIEF DESCRIPTION OF THE DRAWINGS

The other objects, features and advantages will occur to those skilled in the art from the following description of the preferred embodiment and the accompanying drawings in which.

F) DETAILED DESCRIPTION OF THE INVENTION

In the following detailed description, a reference is made to the accompanying drawings that form a part hereof, and in which the specific embodiments that may be practiced is shown by way of illustration. The embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

Figure 1:
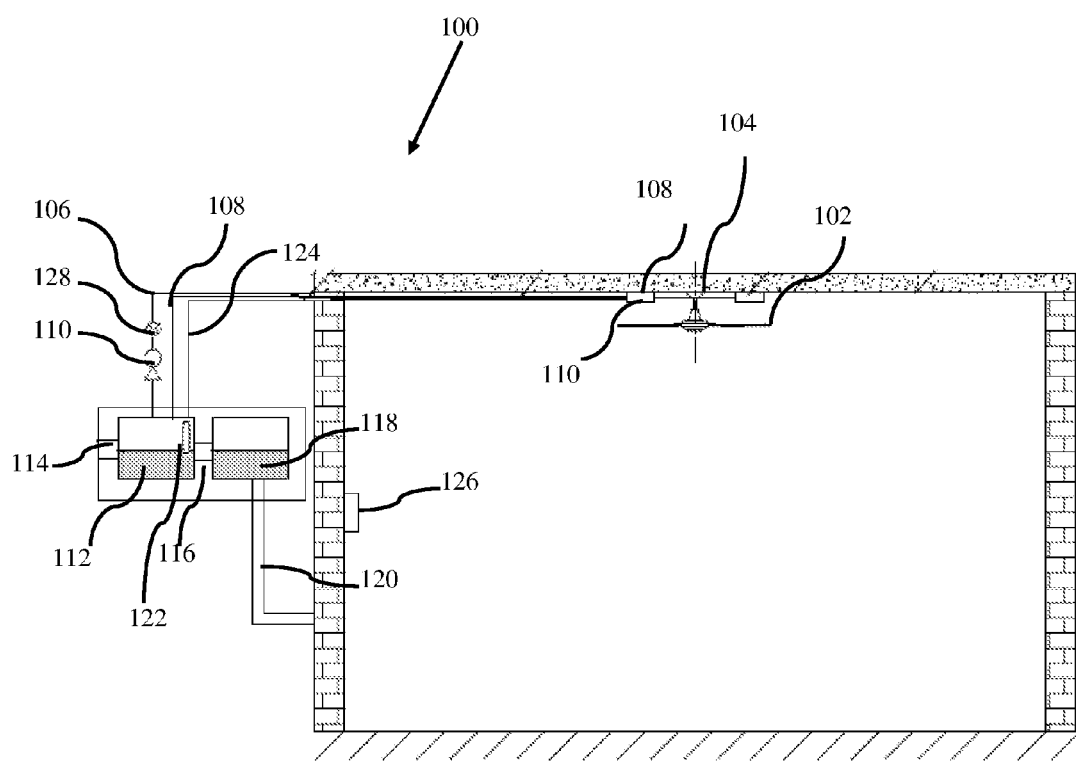
FIG. 1 illustrates a sectional view of the cooling system incorporated with TEC and ceiling fan, according to one embodiment of the present invention.

FIG. 1 illustrates a sectional view of the cooling system incorporated with TEC and ceiling fan, according to one embodiment of the present invention. With respect to FIG. 1, the said system comprises the thermoelectric cooling module (100), which is fitted with a grouting plate (104).

According to one embodiment of the present invention, the thermoelectric cooling module (100) is provided with a hot side management module (108) and a cold side management module (110) in an enclosure.

The thermoelectric cooling module (100) is attached to the ceiling above an electric fan (102). The system further comprises a storage housing with a plurality of compartments. The plurality of compartments further comprises a primary compartment (112) and a secondary compartment (118). The primary compartment (112) is connected with a fluid supply source (106) to circulate cooled fluid using a pump, which is further connected to the hot side management module (108) for heat dissipation. The fluid absorbs the heat from the plurality of thermoelectric sub-module (202) (with reference to FIG. 2) and returns back to the primary compartment (112) through a condensate conduit (124). The primary compartment (112) is further provided with the fresh fluid supply (114) to maintain the fluid in the primary compartment (112) at a natural wet bulb temperature i.e. the ambient wet bulb temperature. The primary compartment (112) also comprises a drain line (116) to drain the processed fluid to the secondary compartment (118), which is further connected to a house piping line (120) to utilize the fresh hot fluid. The primary compartment (112) comprises a fluid level sensor (122) to sense the fluid level in the plurality of compartments. The fluid flow from the primary compartment (112) to the hot side management module (108) is regulated through a solenoid operated valve (128) whose operations are controlled through the integrated control module (126).

The primary compartment (112) further includes a condensate conduit (124), which is further connected to the condensate disposal mechanism of the cold side management module (110). The condensate conduit (124) collects the condensate formed in the fins of the cold side management module (110).

Figure 2:
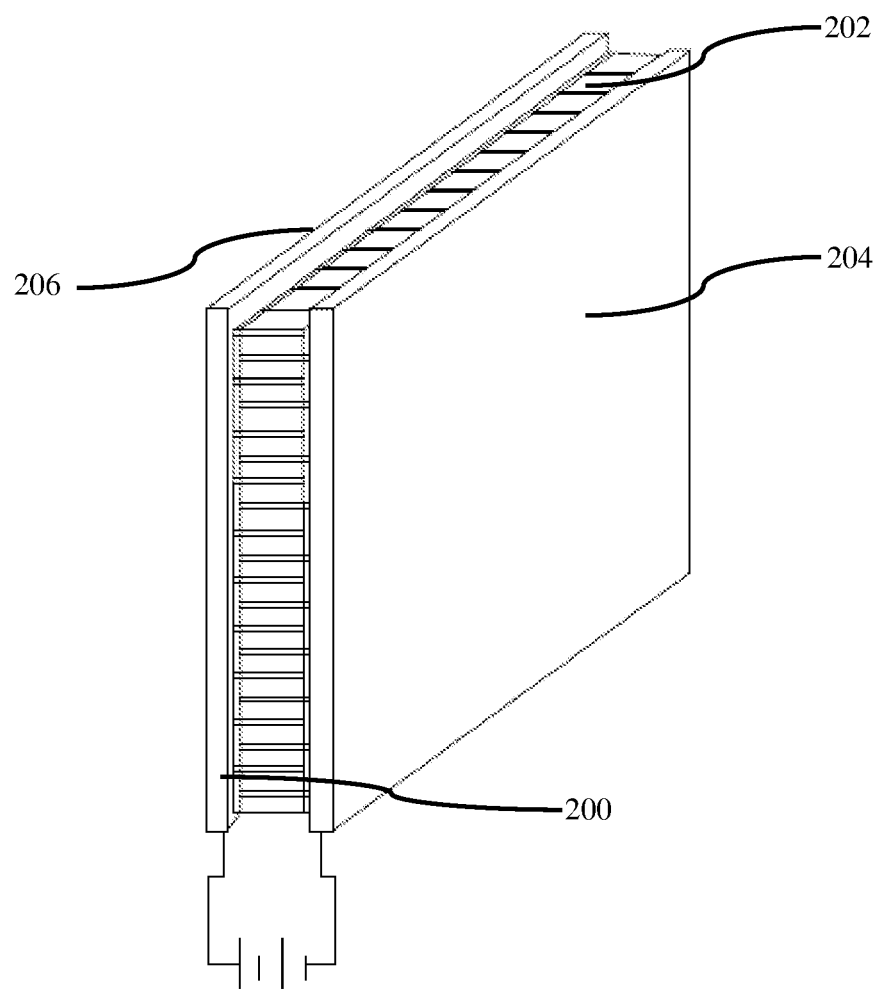
FIG. 2 illustrates an isometric view of the thermoelectric cooling module, according to one embodiment of the present invention.

FIG. 2 illustrates an isometric view of the thermoelectric cooling module, according to one embodiment of the present invention. With respect to FIG. 2, the thermo electric cooling (TEC) device (200) comprises of a plurality of thermoelectric sub-modules (202) (n and p type semiconductor legs) that are connected electrically in series and in parallel thermally. The plurality of thermoelectric sub-modules (202) is sandwiched between two ceramic plates (204 and 206) and fixed by soldering. One side of the thermoelectric cooling module is provided with an epoxy coating or any other suitable coating to prevent a short circuiting in an event of condensation of the trapped air. The plurality of thermoelectric sub-modules (202) comprises two different materials. Due to implementation of two different materials, a voltage gradient is created between two ends of a thermoelectric sub-module (202). When a specified voltage is applied across the said two ends, an electron flow in the thermoelectric sub-module (202) creates a cold side and a hot side. The present invention employs the thermoelectric cooling module (100) along with the electric fan and the components of the hot side management module (108) and the cold side management module (110) to provide optimal cooling to the desired space.

According to one embodiment of the present invention, the ceramic plates (204) and (206) of the thermoelectric cooling (TEC) device (200) provide a high mechanical integrity and good thermal conductivity resulting in a heat transfer with minimal resistance. The said ceramic material may be selected from, but not limited to, aluminum oxide, aluminum nitrate, zinc oxide, silicon dioxide or beryllium oxide.

Figure 3:
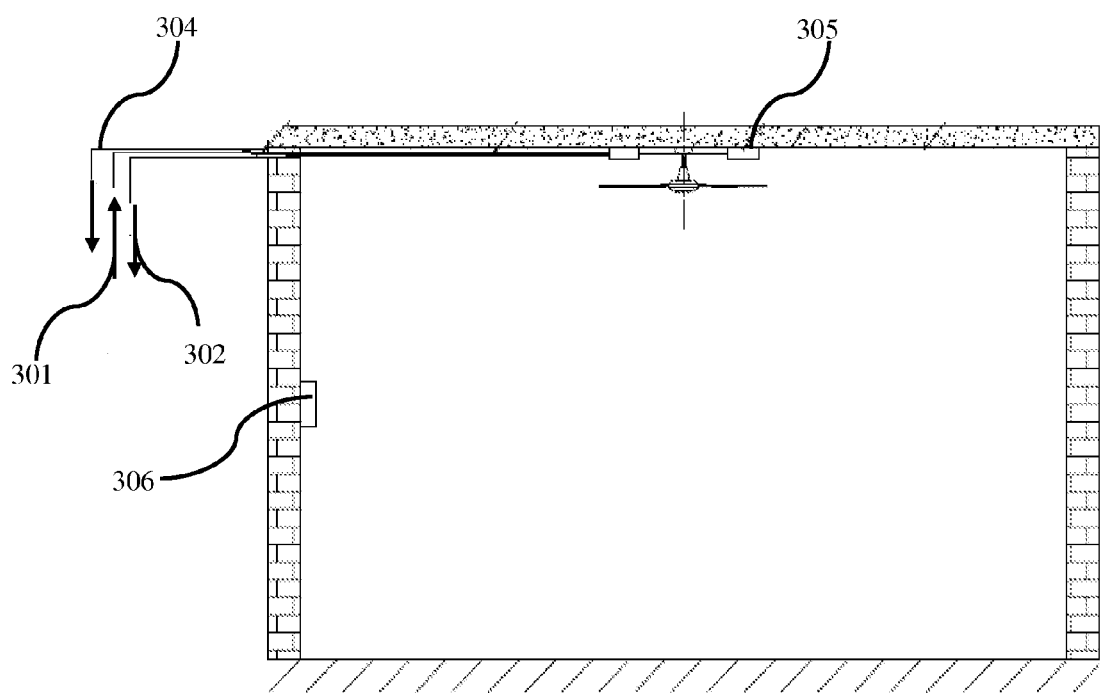
FIG. 3 illustrates a schematic diagram of the fluid circulation mechanism to the cold side management module and the hot side management module together in the housing, according to one embodiment of the present invention.

FIG. 3 illustrates a schematic diagram of the fluid circulation mechanism to the cold side management module and the hot side management module together in the housing, according to one embodiment of the present invention. With respect to FIG. 3, the system comprises a condensate conduit (124), which drains out the collected condensate from the cold side management module (110). The system further comprises fluid supply source (114) to supply the fresh and cold fluid to the plurality of thermoelectric sub-modules. The said system also provides an exit conduit (302) to drain out the fluid carrying the heat from the heat exchanger module (305). The opening and closing duration of the fluid supply source (114), the exit conduit (302) and the condensate conduit (124) are controlled by the integrated control module (126).

Figure 4:
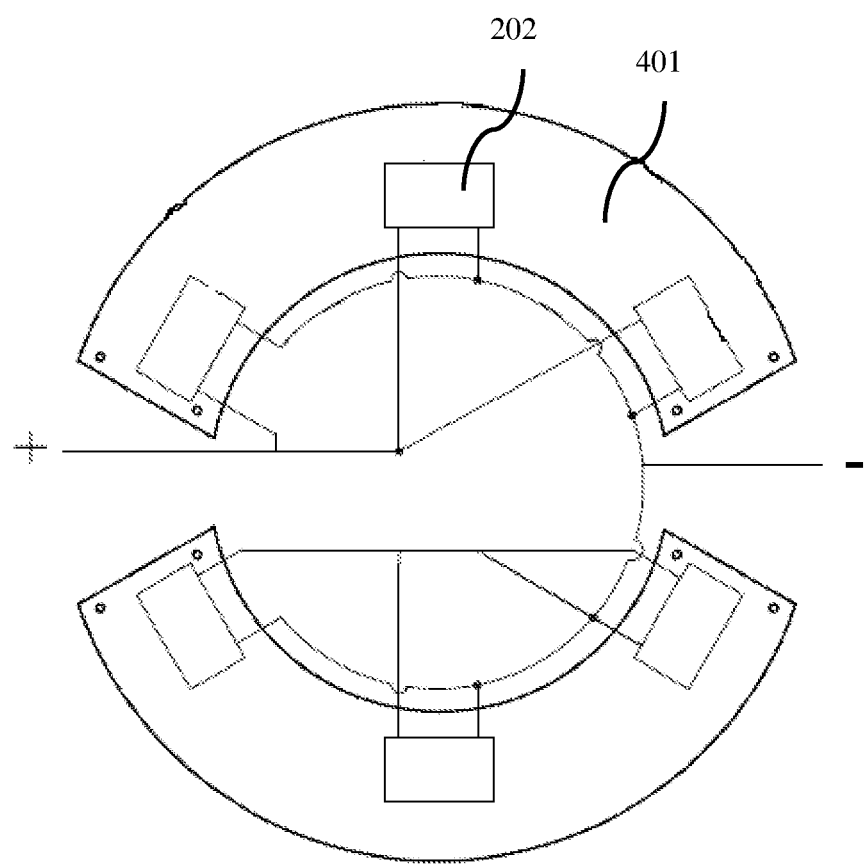
FIG. 4 illustrates a plan of a mounting board, according to one embodiment of the present invention.

FIG. 4 illustrates a plan of a mounting board, according to one embodiment of the present invention. With respect to FIG. 4, the mounting board (401) comprises a plurality of openings. The mounting board (401) is made up of an insulated medium, which is selected from but not limited to the polymeric materials, the natural materials, the mica or any other suitable medium.

The mounting board (401) includes various shapes on the basis of the number of the thermoelectric sub-modules (202). The shape of the mounting boards (401) is selected from but not limited to the square, the rectangular or the semi-circular or circular.

The plurality of thermoelectric sub-modules (202) is attached to the hot side management module (108) by applying a thermally conductive grease to ensure adhesion. The thermally conductive grease is also applied on the plurality of thermoelectric sub-modules (202) and attached to the cold side management module (110). The mounting board (401) ensures no air entrapment between the hot side management module (108) and the cold side management module (110), which helps to prevent condensation.

Figure 5:
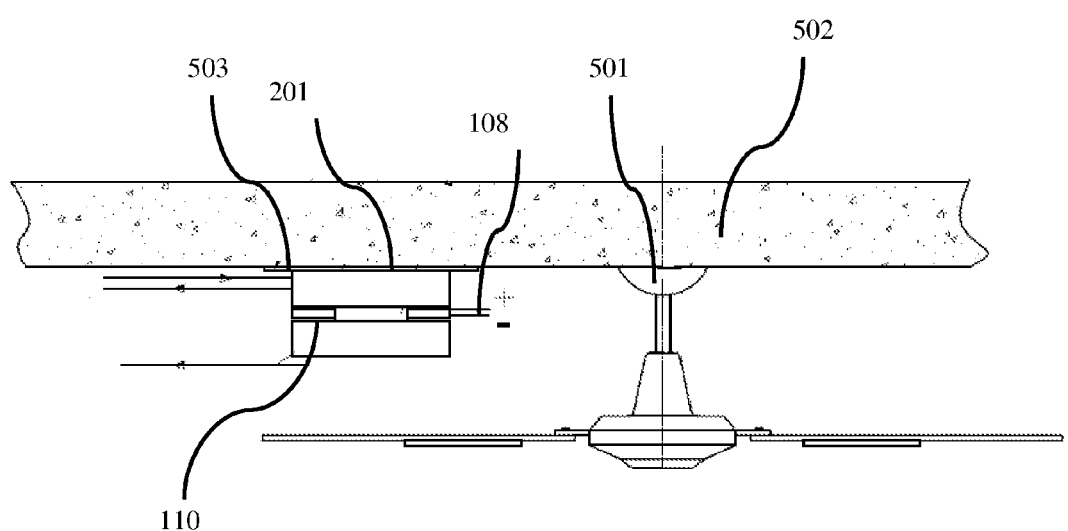
FIG. 5 illustrates an exemplary schematic diagram of a TEC attachment on the ceiling, according to one embodiment of the present invention.

FIG. 5 illustrates an exemplary schematic diagram of a TEC attachment on the ceiling, according to one embodiment of the present invention. With respect to FIG. 5, the thermoelectric cooling device (200) comprises of the plurality of thermoelectric sub-modules (202), the mounting board (201), the hot side management module (108) and the cold side management module (110). The thermoelectric cooling device (200) is positioned on the grouted sheet (503), which is fastened on the ceiling (502) above the electric fan (102).

Figure 6:
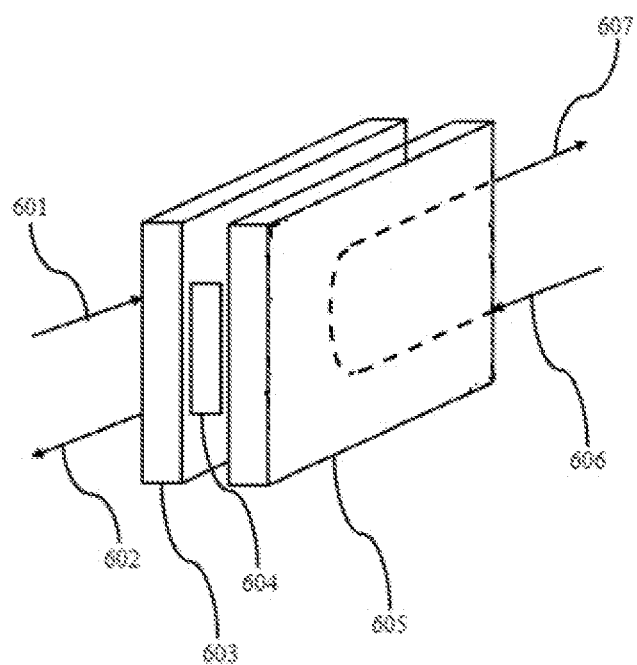
FIG. 6 illustrates an isometric view of the thermoelectric sub-module with the hot side management module and the cold side management module, according to one embodiment of the present invention.

FIG. 6 illustrates an isometric view of the thermoelectric sub-module with the hot side management module and the cold side management module, according to one embodiment of the present invention. With respect to FIG. 6, the plurality of thermoelectric sub-modules (604) is connected with the hot side management module (603). The hot side management module (603) comprises a fluid supply source (601) and a conduit (602) for draining the heat carrying fluid. The cold side management module (605) comprises a fluid supply mechanism to circulate and drain-out the cooled fluid (collected cool) from the thermoelectric sub-modules (604). The cold side management module (605) also includes a fluid supply source (606) and a conduit (607) for draining the cooled fluid.

Figure 7:
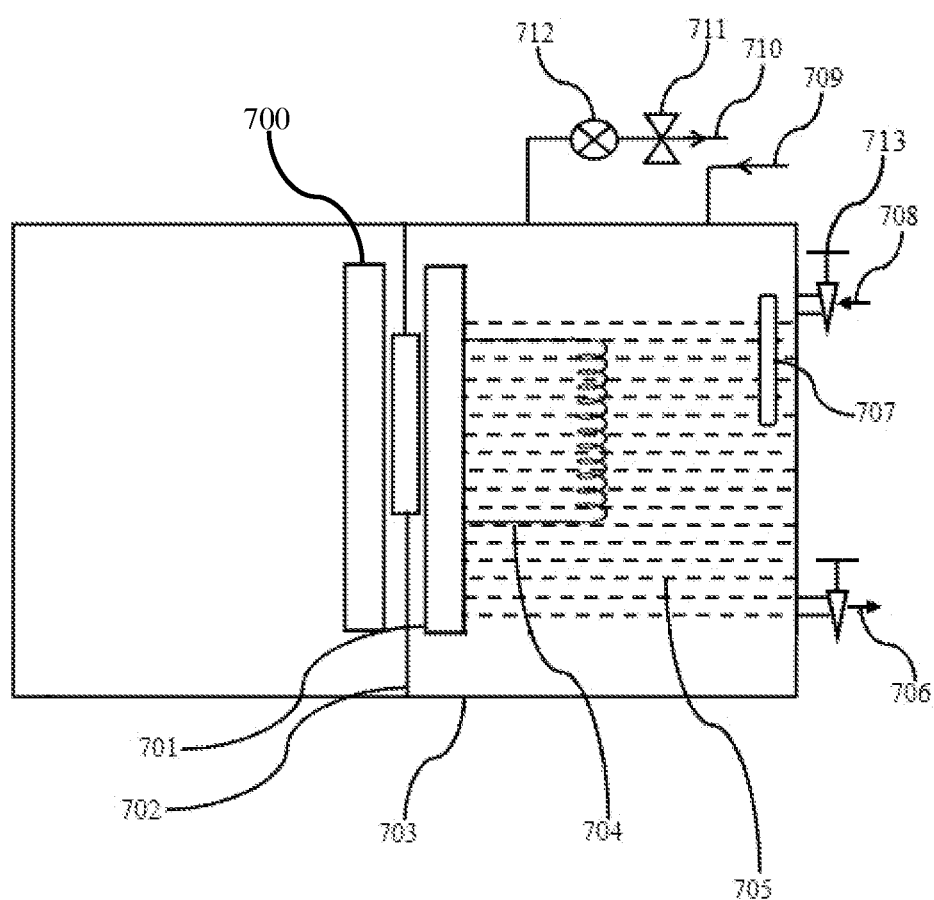
FIG. 7 illustrates an exemplary schematic view of a closed loop mode of the fluid circulatory module of the cold side management module, according to one embodiment of the present invention.

FIG. 7 illustrates an exemplary schematic view of a closed loop mode of the fluid circulatory module, according to one embodiment of the present invention. With respect to FIG. 7, the closed loop module is provided with a multi-chamber compartment or the storage housing (703), which further houses a plurality of thermoelectric sub-modules, the hot side management module (700) and the cold side management modules (701). The storage housing (703) provides an integrated housing unit separator (702) to separate the hot side management module (700) and the cold side management module (701) effectively. The closed loop facilitates the fluid flow across the cold side management module (701). The fluid flow assists in cooling of the cold side management module (701), which in turn cools the fluid (705) in the storage housing (703). The fluid is pumped from the storage housing (703) to the secondary heat exchanger (above the electric fan, not shown here) through the pump (712) whose flow rate is regulated by a regulating valve (711) through an insulated piping (710). The insulated piping (710) supplies the cold fluid to the secondary heat exchanger module. The heat is carried back to the storage housing (703) through the conduit (709). The storage housing (703) is continuously supplied with fresh water supply through the conduit (708), which further comprises a regulatory valve (713). The level of water in the storage housing (703) is monitored through the fluid level sensor (707). The fluid in the storage housing (703) is drained either manually or through a solenoid operated drain valve mechanism (706).

Figure 13:
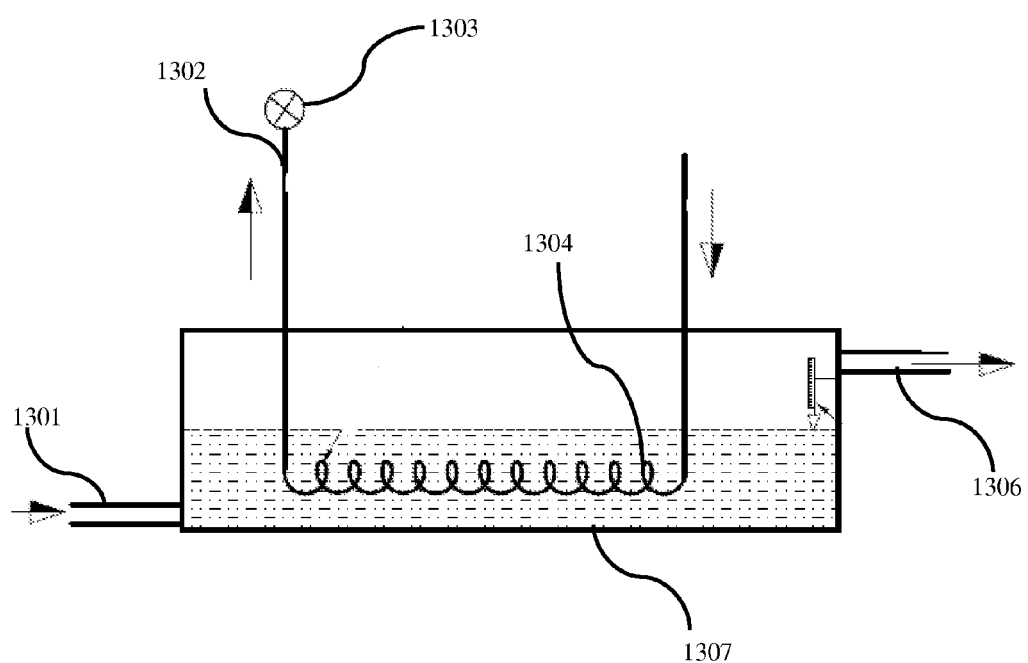
FIG. 13 illustrates a closed loop mode of the fluid circulatory system, according to one embodiment of the present invention.

Further the closed loop mechanism in the hot side management system maintains a fluid flow for collecting and draining the heat (shown distinctly in FIG. 13).

Figure 8:
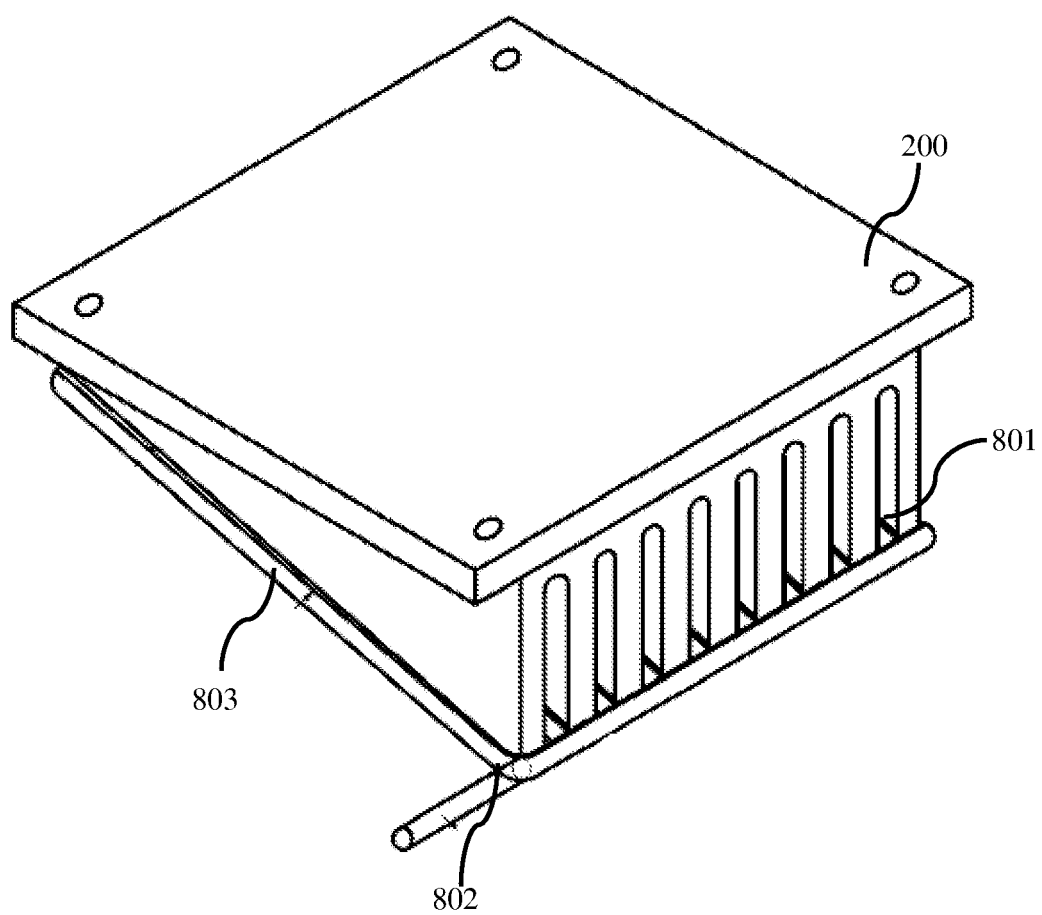
FIG. 8 illustrates an isometric view of a condensate disposal mechanism of the cold side management module, according to one embodiment of the present invention.

FIG. 8 illustrates an isometric view of a condensate disposal mechanism of the cold side management module, according to one embodiment of the present invention. With respect to FIG. 8, the cold side management module of the thermoelectric cooling device (200) is in contact with the secondary heat exchanger, which is further provided with a plurality of fins (801). The plurality of fins comprises a gradient in their structure. Each fin (801) is provided with a plurality of grooves (803). During a condensation on the plurality of fins (801), the fluid droplets flow due to gravity to the groove (803) along the said gradient to the condensate disposal mechanism. The condensate disposal mechanism is further connected to the condensate conduit (802). The condensed fluid droplets are taken back through an additional mechanism (not shown in the figure) to the primary compartment of the storage housing.

Figure 9:
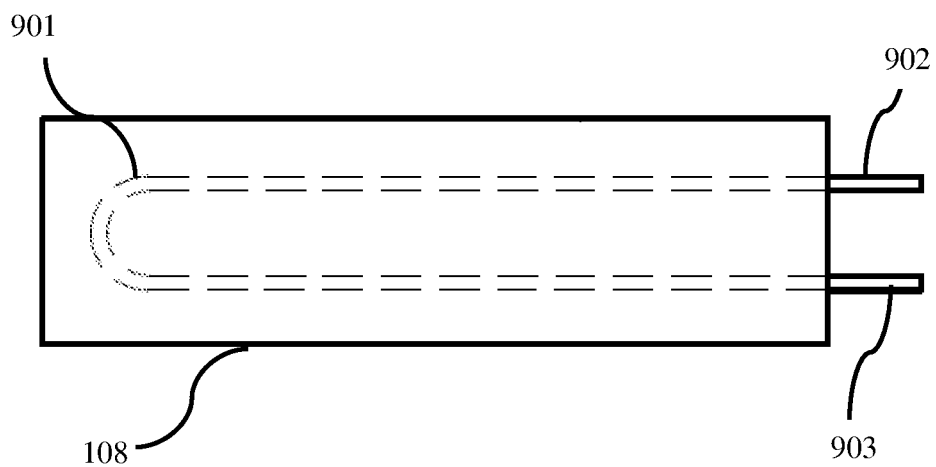
FIG. 9 illustrates a sectional view of the heat exchanger module, according to one embodiment of the present invention.

FIG. 9 illustrates a sectional view of the hot side management system, according to one embodiment of the present invention. With respect to FIG. 9, the hot side management module (108) comprises a transfer conduit (901). The cooled fluid is circulated through fluid supply source (902) for heat absorption. The heat carrying fluid returns through the conduit (903) to the primary compartment of the storage housing.

Figure 10:
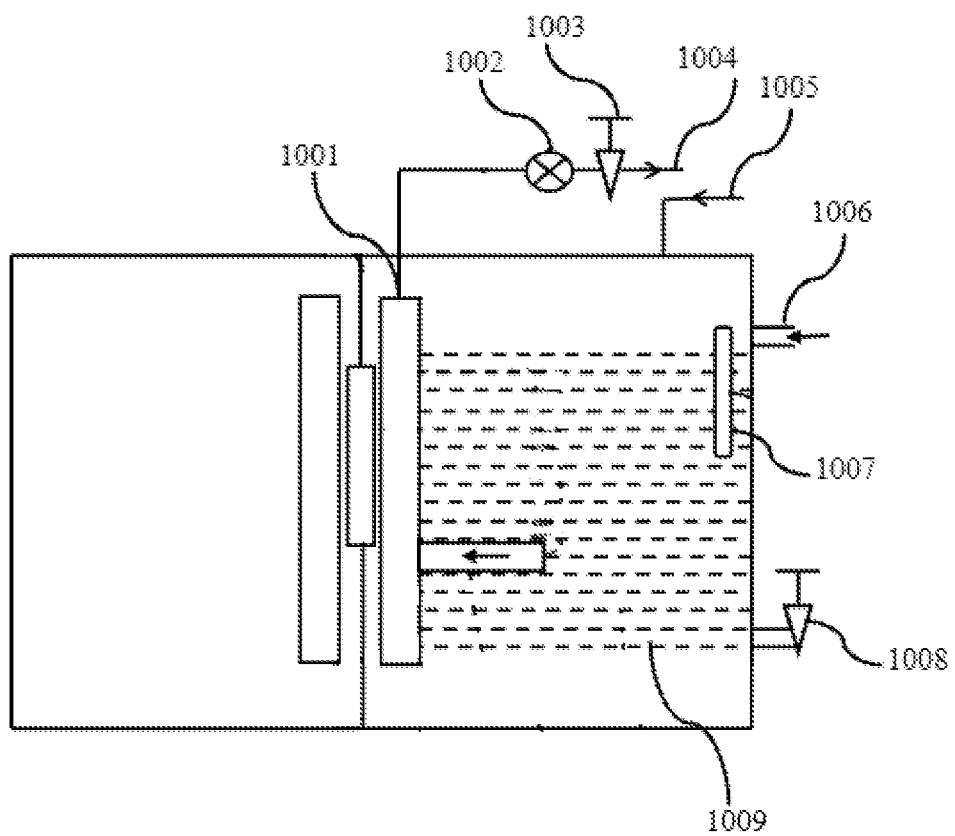
FIG. 10 illustrates an exemplary schematic view of an open loop mode of the fluid circulatory module, according to one embodiment of the present invention.

FIG. 10 illustrates an exemplary schematic view of an open loop mode of the fluid circulatory module provided in the cold side management module, according to one embodiment of the present invention. With respect to FIG. 10, an open loop system in the multi chamber compartment or the housing. The housing comprises the pump (1002) that draws fluid from the cold side management module (1001) and transmits the fluid through the regulating valve (1003). The regulating valve (1003) is further connected to the insulated piping mechanism (1004), which transfers the fluid to the secondary heat exchanger module. A conduit (1005) carries back the fluid after the heat dissipated in the secondary heat exchanger module to the storage housing (1009), which is further supplied with fresh fluid (1006). The fluid level and the temperature are measured by the sensor (1007). The fluid in the storage housing (1009) is drained and regulated through either manually or solenoid operated drain valve (1008).

Figure 12:
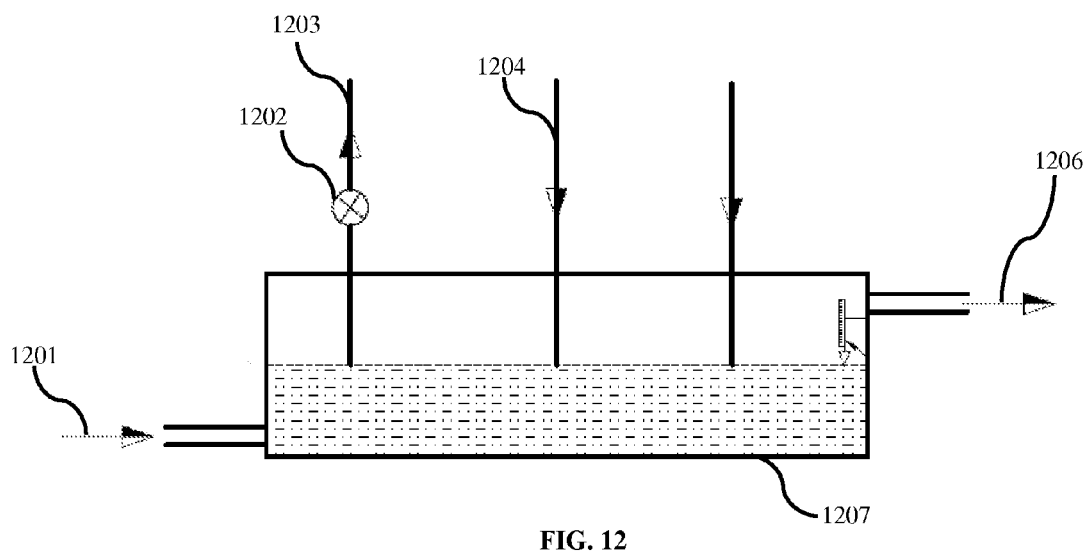
FIG. 12 illustrates an open loop mode of the fluid circulatory module, according to one embodiment of the present invention.

Further the open loop mechanism in the hot side management system maintains a fluid flow for collecting and draining the heat (shown distinctly in FIG. 12).

Figure 11:
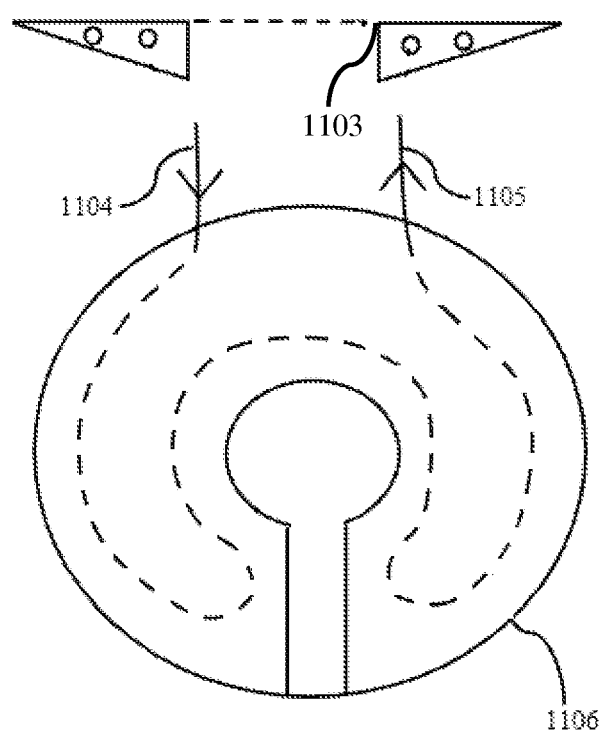
FIG. 11 illustrates the heat exchanger module, according to one embodiment of the present invention.

FIG. 11 illustrates the secondary heat exchanger module with the plurality of fins according to one embodiment of the present invention. With respect to FIG. 11, the heat exchanger module (1106) above the electric fan is made up of a group of materials. The group of materials comprises a die-cast aluminum or its alloy or any other metals or as a plate fin heat exchanger or an aluminum copper single row or multi row heat exchangers. The fins are preferably made of aluminum to allow an inwards fluid flow (1104). The heat generated in the heat exchanger module is taken back through the conduit (1105). The conduit picks up heat from the air coming in contact with the heat exchanger module. The air becomes cool while the fluid becomes warm due to the heat exchange and the heat is taken back through the conduit (1105) to an exit drain. The heat exchanger module (1106) is connected with the cold side management module, which further comprises a groove cut at the bottom of the plurality of fins. The plurality of the fins are shaped but not limited to a triangular shape to enable collection of the condensate. The collected condensate is pumped out through a drain mechanism (1103).

FIG. 12 illustrates an open loop mode of the fluid circulatory module, according to one embodiment of the present invention. With respect to FIG. 12, the open loop mode for heat dissipation facilitates a discharge of the heat carrying fluid in the primary compartment (1207) through the conduit (1204). A continued supply of fresh fluid (1201) maintains water level in the primary compartment (1207) at a natural wet bulb temperature. Alternatively, the primary compartment (1207) comprise an additional cooling mechanism (not shown in the figure) to cool the heat carrying fluid. The cooled water is again supplied by the pump (1202) through the fluid supply source (1203) to the hot side management module. The stored fluid is drained either manually or solenoid controlled drain mechanism (1206).

FIG. 13 illustrates a closed loop mode of the fluid circulatory system, according to one embodiment of the present invention. With respect to FIG. 13, a closed loop mode for heat dissipation the heat carrying fluid passes through a coil (1304), which transfers the heat to the fluid in a separate fluid tank (1307) through convection. Due to the convection of the carried heat, the heat carrying fluid becomes cold and is again supplied to the storage housing through the fluid supply source (1302) using the pump (1303). A continued supply of fresh water (1301) maintains water level in the fluid tank (1307) at a natural wet bulb temperature. The stored fluid is drained either manually or solenoid controlled drain mechanism (1306).

The said system is provided with one or more automatic temperature sensors, which are placed to pick up a Dry bulb temperature (T or DB) and relative humidity (Rh) of ambient air and inside air. The temperature sensors further send acquired data to the integrated control module.

Figure 14:
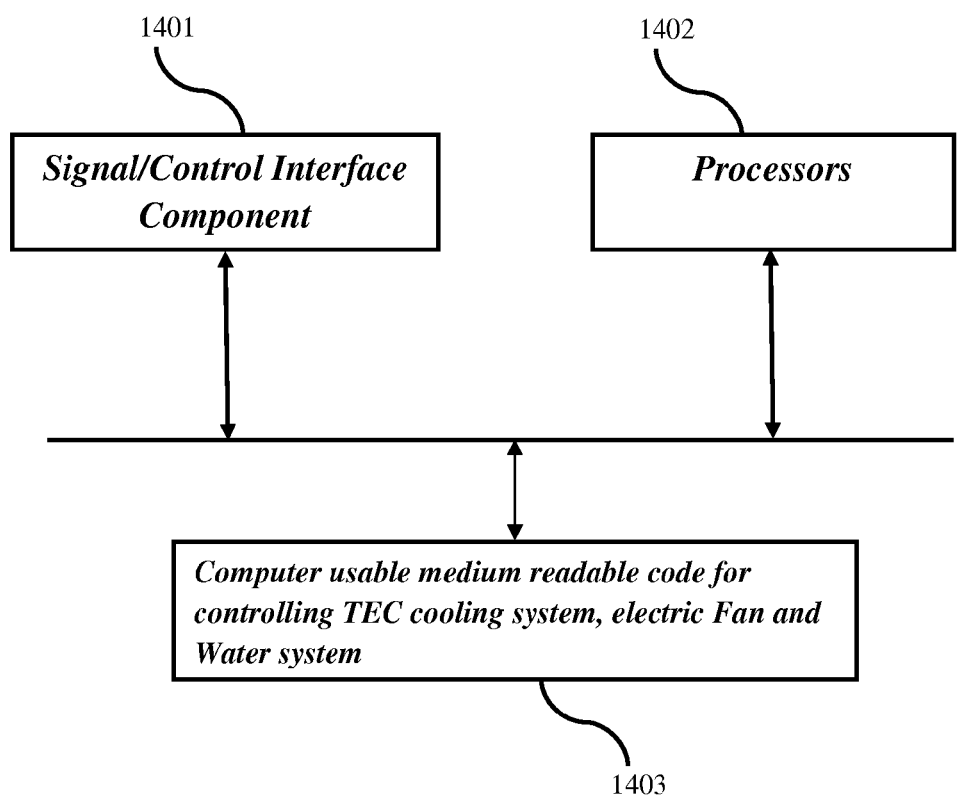
FIG. 14 illustrates a schematic block diagram of the integrated control module, according to one embodiment of the present invention.

FIG. 14 illustrates a schematic block diagram of the integrated control module, according to one embodiment of the present invention. With respect to FIG. 14, the integrated control module further comprises a central processor (1402), a signal interface component (1401) and a computer readable code (1403). The computer readable code (1403) is embedded over the said central processor (1402). The computer readable code (1403) executes a set of pre-determined instructions on the basis a data received from the signal interface component (1401). The signal interface component (1401) is further connected to the plurality of sensors.

According to one embodiment of the present invention, the integrated control module is selected from a micro processor, a programmable logic controller, proportional—integral—derivative controller (PID controller), a micro controller and any other memory device that may be re-programmed or with a pre-program with an ability to send and receive signals and control to ensure functioning of the said.

According to one embodiment of the present invention, the said system can be controlled manually using hand held remote device. In addition to the said feature, the said system also contains a provision for internet or SMS or GPRS communication to ensure unit is switched on prior to coming home.

According to one embodiment of the present invention, the said system is not limited to the electric fan, but it can be incorporated with a pedestal wall mounted fan and also with other types of electric fans. The said system is also suitable for various habitable spaces, which include but not limited to rooms of a residence, office, meeting spaces, cinema hall and auditorium.

According to one embodiment herein, the hot side management module is preferably made of die cast aluminum, its alloy or any other metal or composite that would lend itself to such technology or moulded polymers, or may be made of solid non-metals such or polymers or composites or metal including but not limited to aluminum or its alloy. The conduits may be cut with required provisions for housing the thermoelectric cooling module. The conduits are provided with specific provisions for the fluid flow inside the body of the hot side management module. The conduit comprises one opening for providing an entrance of fluid and another opening for exit of the fluid. The conduit has passages in the hot side management module to allow the fluid flow in a parallel or a zig-zag or a spiral manner to enable the smooth heat transfer from the heat exchanger to the fluid.

According to one embodiment herein, the cold side management module is preferably made up of die cast aluminum, its alloy or any other metal or a composite that lends itself to such technology, or a moulded polymer, or may be made of solid block of non-metals such, or the polymers or composites or metal including but not limited to aluminum or its alloy. The conduits may be cut with required provisions for housing the thermoelectric cooling module. The conduits may be provided with specific provisions for the fluid flow inside the body of the cold side management module. The conduit comprises one opening for providing an entrance of fluid and another opening for exit of the fluid. The conduit has passages in the cold side management module to allow the fluid flow in a parallel or a zig-zag or a spiral manner to enable the smooth heat transfer from the cold sink, which is heat exchanger to the fluid where by the fluid exchanges heat.

The present invention provides a system and a method for providing an optimal cooling on the basis of an external weather condition. The present invention further provides a system and a method for providing an optimal cooling by implementing an efficient fluid circulation mechanism. The present invention also provides a system and a method with a dynamic management over the working of various modules of the said system. The present invention is cost effective and comprises of less complex circuitry. The present invention also leads to less power consumption.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims.

I claim:

1. A system for an optimal cooling by a thermoelectric cooling module and an electric fan thereof, the system comprises: a) a thermoelectric cooling module, wherein the thermoelectric cooling module comprises: a plurality of thermoelectric sub-modules, wherein the plurality of thermoelectric sub-modules are connected electrically in series, wherein the plurality of thermoelectric sub-modules are connected thermally in parallel, wherein the plurality of thermoelectric sub-modules are fixed to a rigid surface by sand-witching and soldering between at-least two ceramic plates, and wherein the plurality of thermoelectric sub-modules are called Peltier chip(s); a hot side management module, wherein the hot side management module provides a fluid circulation to the plurality of thermoelectric sub-modules; a cold side management module, wherein the cold side management module provides a fluid circulation to the plurality of thermoelectric modules, and wherein the cold side management module is connected at a pre-determined separation from the hot side management module; an integrated control module, wherein the integrated control module is connected to the plurality of thermoelectric sub-modules, the hot side management module, the cold side management module and the electric fan, wherein the integrated control module provides controls the working of the plurality of thermoelectric sub-modules, the hot side management module, the cold side management module and the electric fan; b) a housing, wherein the housing provides an enclosure for the plurality of thermoelectric sub-modules, the hot side management module and the cold side management module; c) the electric fan, wherein the electric fan is driven by an alternate current or a direct current, wherein the electric fan runs at variable speeds, wherein a speed or an oscillation of the electric fan is dynamically varied by the integrated control module, wherein the oscillation of the electric fan is provided under a direct current supply; and wherein the plurality of thermoelectric sub-modules restrict a contact between a hot side management module and a cold side management module, wherein the plurality of thermoelectric sub-modules avoid a condensation of an air on the cold side management module by preventing an entrapment of the air, and wherein the components of the thermoelectric cooling modules are made of a minimum heat loss circuitry.

2. The system according to claim 1, wherein the hot side management module comprises: a) a fluid supply source, wherein the fluid supply source supplies a fresh ambient fluid at a natural wet-bulb temperature; b) a fluid cooling sub-module, wherein the fluid cooling sub-module is connected with the fluid supply source, wherein the fluid cooling sub-module cools a fresh ambient fluid to a natural wet bulb temperature; c) a storage housing, wherein the storage housing holds the fluid required for an operation of the said system, wherein the said storage housing has a plurality of compartments, wherein the plurality of compartments are provided for a plurality of fluid circuits, wherein the plurality of fluid circuits facilitate a transfer of an ambient or a fresh fluid, a heat dissipation, a heat transfer and a fluid drain; d) a primary fluid level sensor module, wherein the primary fluid level sensor module tracks an instantaneous level of fluid; e) a pump, wherein the pump maintains a fluid flow across the hot side management module; f) a primary heat exchanger module, wherein the primary heat exchanger module collects the heat from the hot side management module by supplying the fluid, wherein the primary heat exchanger module provides at-least one piping or at-least one conduit to collect the heat carrying fluid; g) a heat dissipation module, wherein the heat dissipation module disposes the collected heat, wherein the heat dissipation resupplies the heat carrying fluid back to the storage system; and h) a control circuit, wherein the control circuit regulates a flow of fluid or fluid among the plurality of compartments and the heat dissipation module to maintain fluid at a planned and a guided temperature; and wherein the hot side management module further comprises a plurality of pressure regulatory valves, wherein the plurality of pressure regulatory valves dispose excess fluid in the hot side management module and the cold side management module, and wherein the hot side management module directly disposes excess fluid.

3. The system according to claim 1, wherein the cold side management module comprises: a) a plurality of fins, wherein the plurality of fins are provided with a gradient, wherein each fin is provided with a plurality of grooves; b) a looped module, wherein the looped module consists a fluid, wherein the looped module is either an open module or a closed module, and wherein the fluid provides a temperature regulation in the cold side management module; c) a secondary heat exchanger module, wherein the secondary heat exchanger module is made either of a metal or a non metal, wherein the heat exchanger module, wherein the secondary heat exchanger module on the cold side management module is aerodynamically designed to facilitate minimum pressure losses; d) a fluid circulatory module, wherein the fluid circulatory module comprises: a storage housing, wherein the storage housing holds the fluid required for an operation of the said system, wherein the said storage housing has a plurality of compartments, wherein the plurality of compartments are provided for a plurality of fluid circuits, wherein the plurality of fluid circuits facilitate a transfer of an ambient or a fresh fluid, a heat dissipation, a heat transfer and a fluid drain; a secondary fluid level sensor, wherein the secondary fluid level sensor functions either manually or automatically; a pressure adjusting mechanism, wherein the pressure adjusting mechanism comprises a plurality of pressure regulatory valves and a pumping module, wherein the pressure regulatory valves regulate extra pressure caused due to an excess fluid, and wherein the pumping module pumps a cold fluid across the secondary heat exchanger module; and e) a condensate disposal mechanism, wherein the condensate disposal mechanism collects a condensed fluid through a condensate conduit, wherein the condensate disposal mechanism consists a collecting loop and a disposing mechanism, wherein the plurality of grooves route the condensing fluid over the collecting loop, wherein the plurality of grooves collect the vertically dripping condensate on the surface of the plurality of fins with condensate flowing in the plurality of grooves due to the gradient with collecting loop along the edge of all the fins, wherein the collecting loop is connected to the disposing mechanism, wherein the disposing mechanism disposes the condensed fluid either through a return conduit of fluid or through a direct medium.

4. The system according to claim 1, wherein the integrated control module further comprises three sub-modules, wherein the three sub-modules are; a) a calibration sub-module, wherein the calibration sub-module comprises a plurality of sensors to calibrate a temperature and a relative humidity of an ambient air and an inside air, wherein the calibration sub-module further calibrates a plurality of air properties, wherein the plurality of air properties comprise a wet bulb temperature, a dew point temperature, a specific volume, an absolute humidity and an enthalpy; b) a control sub-module, wherein the control module comprises an algorithm and a program, wherein the control module provides an appropriate setting of the indoor temperature and the relative humidity, wherein the control sub-module provides an adaptive comfort that depends on the ambient air property and a capacity of the thermoelectric cooling module, wherein the control module regulates a speed of the electric fan regulates the fluid flow on the basis of an external temperature and humidity, wherein the control sub-module also regulates fluid flow in both the hot side and the cold side management module and the total power to thermoelectric cooling module on the basis of an external temperature and humidity, and wherein the adaptive comfort provides a thermal comfort to a user; and c) a power sub-module, wherein the power sub-module provides an alternate current or a direct current to the thermoelectric cooling module, a fan, a pump and a plurality of electrically powered components including a plurality of sensors, wherein the power sub-module enables an integrated control system to vary a cooling capacity of the plurality of thermoelectric sub-modules, wherein the power sub-module regulates a flow of fluid to transfer a heat, wherein the power sub-module further varies a speed of the electric fan to increase or decrease an air flow, wherein the power sub-module senses a level and a temperature of the fluid in the hot side management module and the fluid in the cold side management module gives a feedback to the said system, and wherein the calibration sub-module, the control sub-module and the power sub-module work seamlessly and continuously with a sensors feeding information and controls operating the various components to effect a dynamic operation of all the components and the said system.

5. The system according to claim 1, wherein the hot side management module provides enhanced heat dissipation by maintaining a temperature of the fresh fluid equivalent to a wet bulb temperature of ambient air,
wherein a mode of heat dissipation through the hot side management module comprises:
a) the hot side management module applies a closed loop to circulate a working fluid for disposing the heat is cooled through an additional cooling mechanism, wherein the cooled fluid is circulated back to the storage housing; and
b) the hot side management module applies an open loop, wherein the open loop provides a fresh supply of fluid for cooling, wherein the open loop provides a separate exit conduit for fluid disposal; and
wherein the supply of fresh fluid is maintained at temperature of ambient wet bulb to provide enhanced heat dissipation in both the closed loop and the open loop.

6. The system according to claim 1, wherein the cold side management module provides enhanced heat exchange between the room air and the operating fluid through the secondary heat exchanger module, wherein a mode of heat dissipation through the cold side management module comprises:
a) the cold side management module applies a closed loop to circulate a working fluid for disposing the heat is cooled through an additional cooling mechanism, wherein the cooled fluid is circulated back to the storage housing; and
b) the cold side management module applies an open loop, wherein the open loop provides a fresh supply of fluid for cooling, wherein the open loop provides a separate exit conduit for fluid disposal; and
wherein the supply of fresh fluid is maintained at temperature of ambient wet bulb to provide enhanced heat dissipation in both the closed loop and the open loop.

7. The system according to claim 1, wherein the said system further comprises: a) at least one processor; and b) a computer readable medium; c) at least one computer readable code embedded in the computer readable medium, wherein the computer readable code instructs at-least one processor to perform a plurality of functions, wherein the plurality of functions comprises: d) obtaining data to determine an amount of fluid in the storage housing; e) providing a plurality of operating signals on the basis of the obtained data, wherein the plurality of operating signals is provided to the fluid supply source in the hot side management module and the fluid circulatory module in the cold side management module, and wherein the plurality of operating signals enables an operation of the fluid supply source in the hot side management module and the fluid circulatory module in the cold side management module for a predetermined time interval.

8. The system according to claim 1, wherein the hot side management module and the cold side management module are provided in a single housing.

9. The system according to claim 1, wherein the hot side management module and the cold side management module are provided in separate housing.

10. A method for an optimal cooling by a thermoelectric cooling module and an electric fan thereof, the method comprises: a) initiating a system, wherein the electric fan in the said system is switched "ON"; b) calibrating a plurality of thermal and environmental parameters through an integrated control module, wherein the plurality of parameters comprises a temperature, an ambient relative humidity, a specific volume of air and an absolute humidity; c) providing a plurality of guideline to said system, wherein the plurality of guidelines are provided by the integrated control module on the basis of the plurality of calibrated parameters, and wherein the plurality of guidelines are dynamic in nature and varies with variation in the plurality of calibrated parameters; d) instructing the hot side management module and the cold side management module to function within the provided guidelines; e) maintaining a temperature of the fluid in the fluid circulation mechanism at a wet bulb temperature; f) maintaining an adequate fluid flow on the basis of the plurality of calibrated parameters; g) collecting the heat generated in the hot side management module and the cold side management module; and h) disposing the collected heats, wherein the cold side management module provides a cooling effect by distributing the cool area uniformly across a surface of a secondary heat exchanger module, a plurality of fins and grooves provided in said system, wherein the cold side management applies a gradient to collect a condensate formed due to condensation of the room air under specific conditions, wherein the cold side management module disposes the collected condensate either through a reverse circulation of the fluid or directly to the ambient air.

11. The method according to claim 10, wherein the integrated control module facilitates a plurality of calibrations, wherein the plurality of calibrations comprises: a) calculating the ambient and the room air properties; b) setting a plurality of indoor performance parameters to facilitate an adaptive control; and c) powering said system with either an alternate current or a direct current with varying voltages and currents.

* * * * *